United States Patent
Chang et al.

(10) Patent No.: US 8,258,615 B2
(45) Date of Patent: Sep. 4, 2012

(54) SEMICONDUCTOR DEVICE AND FABRICATING METHOD THEREOF

(75) Inventors: Sheng-Ming Chang, Taipei County (TW); Che-Yuan Jao, Hsinchu (TW); Ching-Chih Li, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 628 days.

(21) Appl. No.: 12/389,388

(22) Filed: Feb. 20, 2009

(65) Prior Publication Data
US 2009/0224393 A1 Sep. 10, 2009

Related U.S. Application Data

(60) Provisional application No. 61/034,494, filed on Mar. 7, 2008.

(51) Int. Cl.
*H01L 23/498* (2006.01)
(52) U.S. Cl. .. 257/690; 257/686; 257/712; 257/E21.499
(58) Field of Classification Search .................. 257/774, 257/786, 532, 690, 712, E29.342, E21.499, 257/E23.06; 438/122
See application file for complete search history.

(56) References Cited

U.S. PATENT DOCUMENTS

| | | | |
|---|---|---|---|
| 6,305,000 B1 * | 10/2001 | Phan et al. | 716/120 |
| 7,361,980 B2 * | 4/2008 | Hosoyamada et al. | 257/678 |
| 7,462,941 B2 * | 12/2008 | Campbell et al. | 257/781 |
| 2005/0199995 A1 | 9/2005 | Nomoto | |

FOREIGN PATENT DOCUMENTS

| | | |
|---|---|---|
| CN | 1508870 A | 6/2004 |
| CN | 1681117 A | 10/2005 |
| TW | I298532 | 7/2008 |

* cited by examiner

*Primary Examiner* — Roy Potter
(74) *Attorney, Agent, or Firm* — Winston Hsu; Scott Margo

(57) ABSTRACT

The present invention provides a semiconductor device capable of eliminating voltage (IR) drop of a semiconductor die inside the semiconductor device and a fabricating method of the semiconductor device. The semiconductor device comprises the semiconductor die, and the semiconductor die comprises a first surface area, a plurality of first pads potentially equivalent to each other, a passivation layer, a plurality of first openings, and a first conducting medium layer. The passivation layer is disposed on the plurality of first pads. The plurality of first openings is formed on the passivation layer, and utilized for exposing the plurality of first pads. The first conducting medium layer is formed on the first surface area, and utilized for fulfilling the plurality of first openings to connect the plurality of first pads.

18 Claims, 11 Drawing Sheets

SEMICONDUCTOR DEVICE AND FABRICATING METHOD THEREOF

CROSS REFERENCE TO RELATED APPLICATIONS

This application claims the benefit of U.S. Provisional Application No. 61/034,494, filed on Mar. 7, 2008 and included herein by reference.

BACKGROUND

The present invention relates to a semiconductor device and a fabricating method thereof, and more particularly, to a semiconductor device capable of eliminating voltage (IR) drop of a semiconductor die inside the semiconductor device and a fabricating method of the semiconductor device.

Many conventional semiconductor devices are mounted in packages such as Quad Flat Packs (QFPs) and Pin Ball Gate Arrays (PBGAs) in which the input and output terminals are arranged along the edge of the semiconductor die. Arranging the terminals along the semiconductor die edge may result in relatively long wirings on silicon to supply power and ground to the center of the semiconductor die. These long wirings generally have a relatively high resistance leading to the unacceptable IR drops.

There are several conventional approaches for solving IR drop of the semiconductor dies. For example, one of the conventional approaches is increasing metal layers to decrease overall resistance of the semiconductor dies; another one of the conventional approaches is increasing metal thickness to decrease overall resistance of the semiconductor dies; and the other one of the conventional approaches is using the flip chip technology to connect chip internal nodes directly.

However, the conventional approaches of increasing the metal layers and using the flip chip technology cost a lot, and the conventional approach of increasing the metal thickness help little.

SUMMARY OF THE INVENTION

It is therefore one of the objectives of the present invention to provide a semiconductor device capable of eliminating voltage (IR) drop of a semiconductor die inside the semiconductor device and a fabricating method of the semiconductor device, so as to solve the above problem.

In accordance with an embodiment of the present invention, a semiconductor device is disclosed. The semiconductor device comprises a semiconductor die, and the semiconductor die comprises a first surface area, a plurality of first pads potentially equivalent to each other, a passivation layer, a plurality of first openings, and a first conducting medium layer. The passivation layer is disposed on the plurality of first pads. The plurality of first openings are formed on the passivation layer, and utilized for exposing the plurality of first pads. The first conducting medium layer is formed on the first surface area, and utilized for fulfilling the plurality of first openings to connect the plurality of first pads.

In accordance with an embodiment of the present invention, a fabricating method of a semiconductor device comprising a semiconductor die is disclosed. The method comprises: defining a first surface area on the semiconductor die; forming a plurality of first pads inside the semiconductor die, wherein the plurality of first pads are potentially equivalent to each other; forming a passivation layer on the plurality of first pads; forming a plurality of first openings on the passivation layer to expose the plurality of first pads; and forming a first conducting medium layer on the first surface area to fulfill the plurality of first openings to connect the plurality of first pads.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
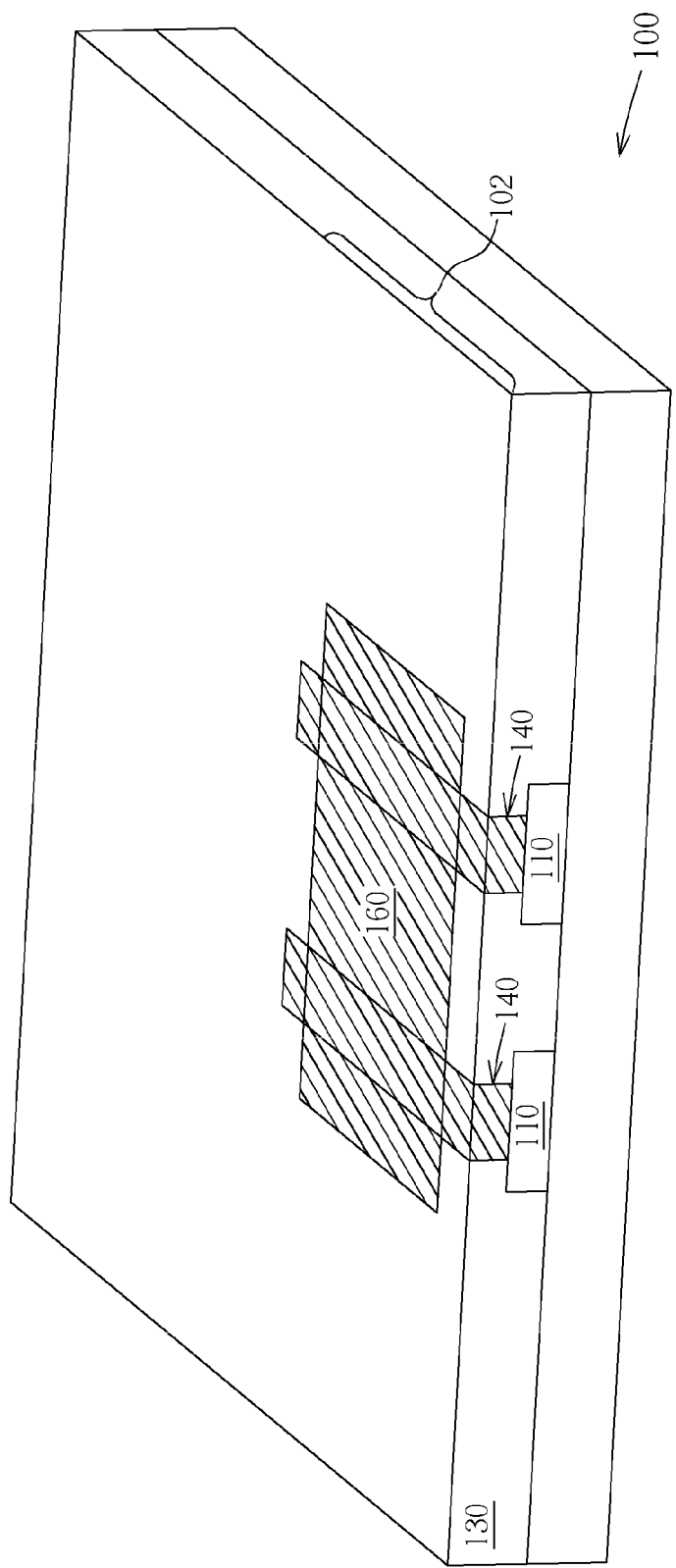
FIG. 1 shows a simplified 3-D diagram of a semiconductor die in accordance with a first embodiment of the present invention.
Figure 2:
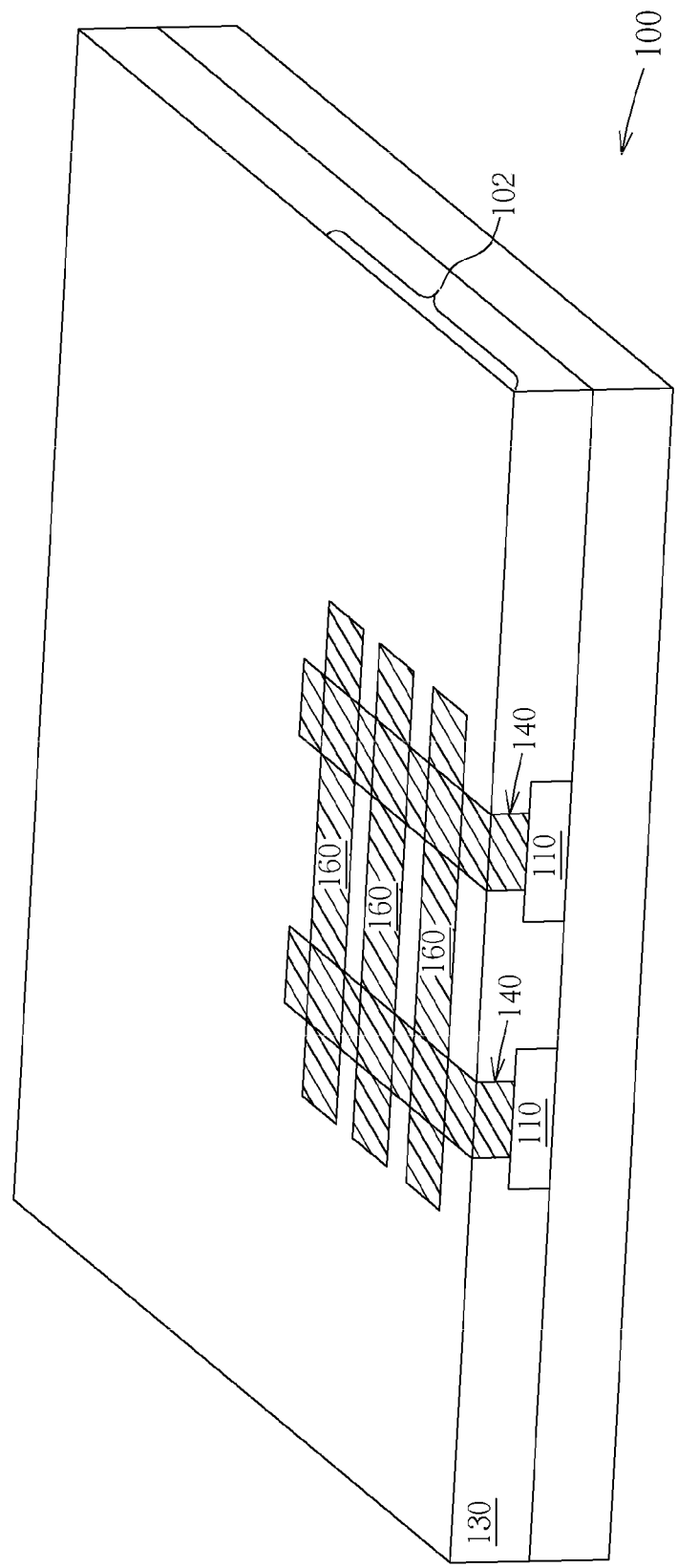
FIG. 2 shows another simplified 3-D diagram of the semiconductor die in accordance with the first embodiment of the present invention.

Please refer to FIG. 1. FIG. 1 shows a simplified 3-D diagram of a semiconductor die 100 in accordance with a first embodiment of the present invention. As shown in FIG. 1, the semiconductor die 100 comprises a surface area 102, two pads 110, a passivation layer 130, two openings 140, and a conducting medium layer 160, wherein the pads 110 are potentially equivalent to each other, and the conducting medium layer 160 can be a conducting adhesive layer such as a conducting resin. The passivation layer 130 is disposed on the pads 110, and the openings 140 are formed on the passivation layer 130, and utilized for exposing the pads 110. The conducting medium layer 160 is formed on the surface area 102, and utilized for fulfilling the openings 140 to connect the pads 110 so as to solve the voltage (IR) drop of the semiconductor die 100. Please note that the above embodiment is only for an illustrative purpose and is not meant to be a limitation of the present invention. For example, the shape of the conducting medium layer 160 is not limited to be a bulk as shown in FIG. 1, and the shape of the conducting medium layer 160 also can be slices as shown in FIG. 2.

Figure 3:
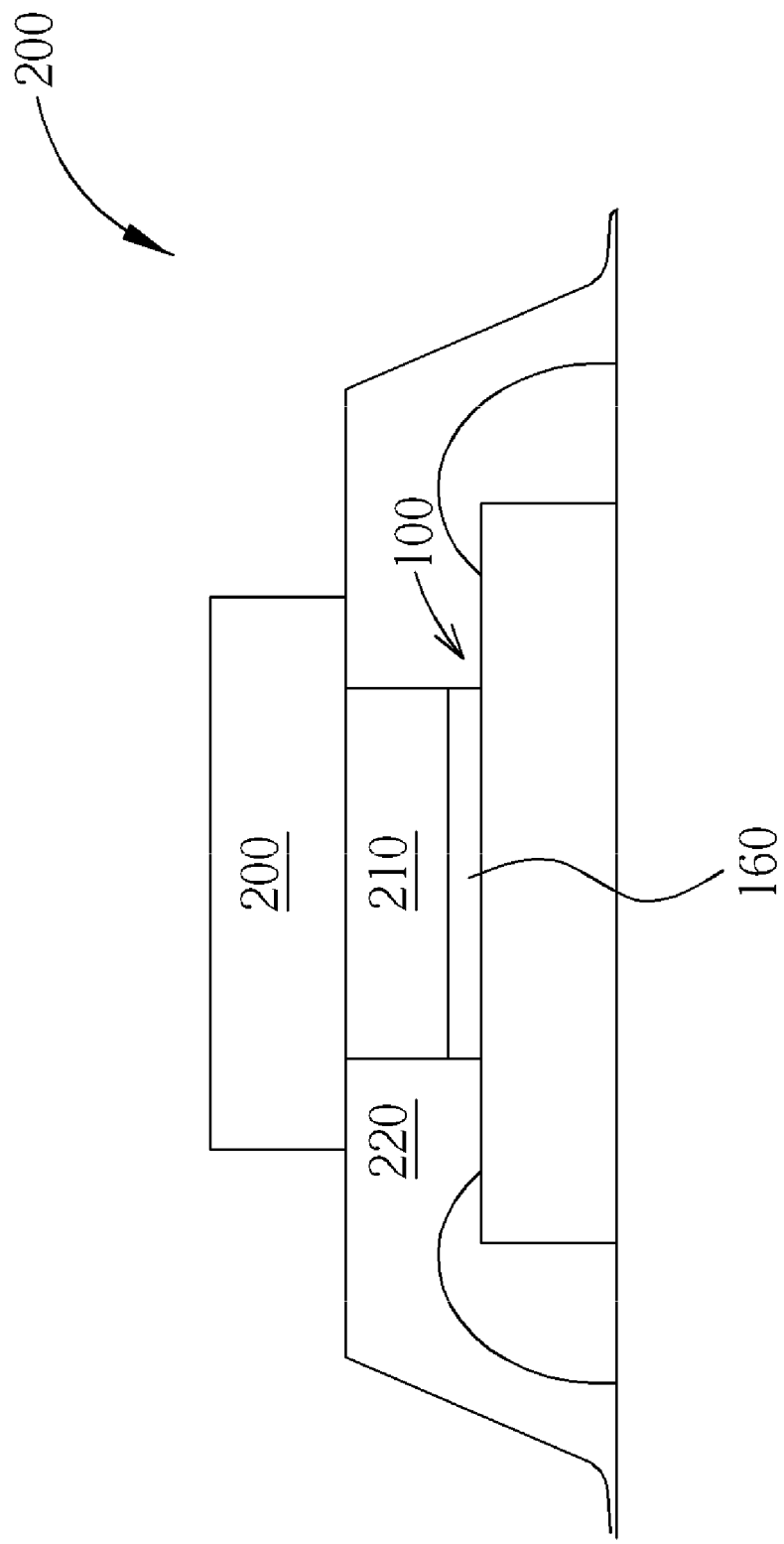
FIG. 3 shows a simplified diagram of a semiconductor device (i.e. a chip) comprising the semiconductor die shown in FIG. 1 in accordance with a second embodiment of the present invention.

Please refer to FIG. 3. FIG. 3 shows a simplified diagram of a semiconductor device (i.e. a chip) 200 comprising the semiconductor die 100 in accordance with a second embodiment of the present invention. As shown in FIG. 3, the semiconductor device 200 further comprises a dummy die 210, a molder 220, and a heat sink 230. The dummy die 210 is disposed on the conducting medium layer 160 of the semiconductor die 100, and utilized for stabilizing conducting performance of the conducting medium layer 160 and dissipating heat from the semiconductor die 100. The molder 220 is utilized for surrounding the dummy die 210 and sealing the semiconductor die 100. The heat sink 230 is formed on the dummy die 210 and the molder 220. Please note that the above embodiment is only for an illustrative purpose and is not meant to be a limitation of the present invention. For example, the dummy die 210 can be replaced with a metal layer.

Figure 4:
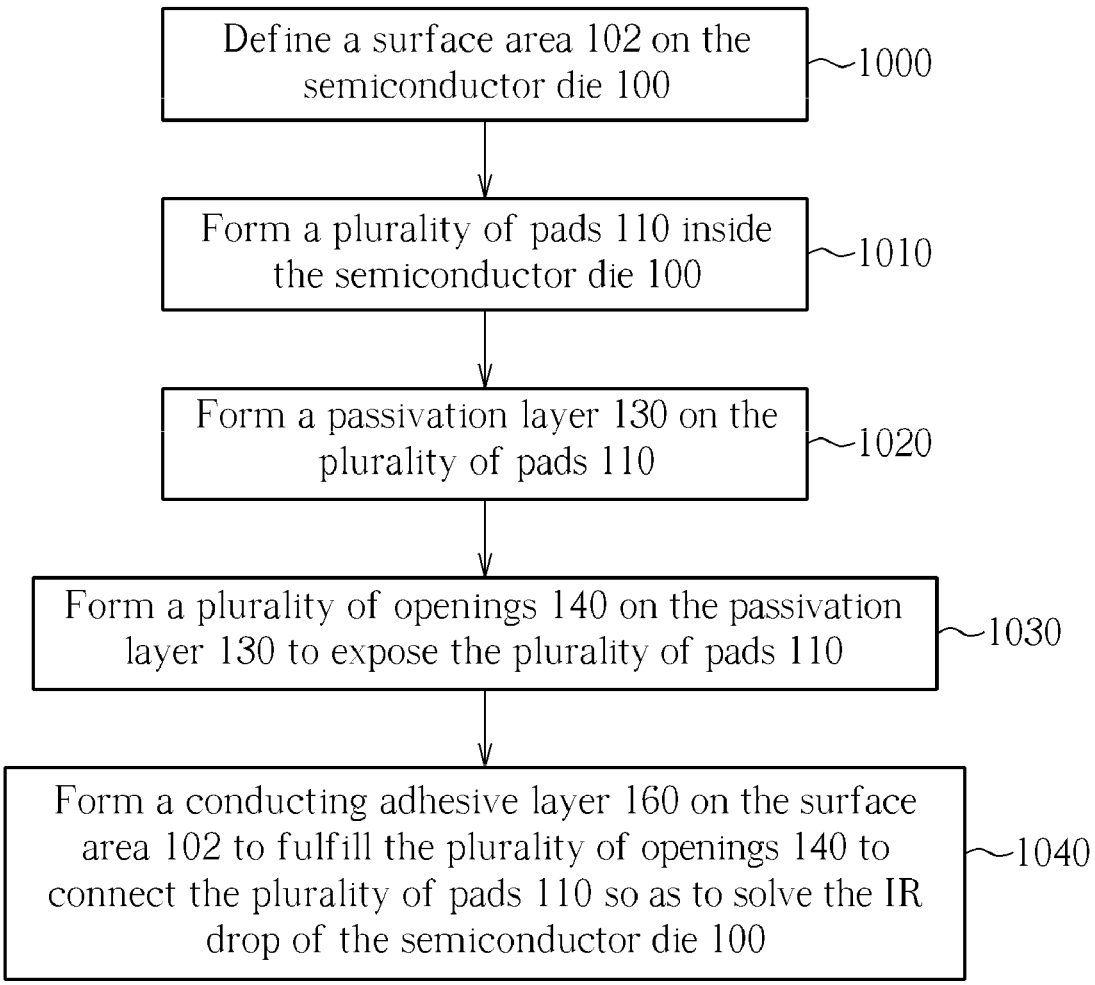
FIG. 4 is a process flowchart showing a fabricating method of the semiconductor device comprising the semiconductor die shown in FIG. 3.

Please refer to FIG. 4. FIG. 4 is a process flowchart showing a fabricating method of the semiconductor device 200 comprising the semiconductor die 100. Provided that substantially the same result is achieved, the steps of the process flowchart need not be in the exact order shown and need not be contiguous, that is, other steps can be intermediate. The fabricating method of the semiconductor device 200 comprising the semiconductor die 100 according to the present invention comprises the following steps:

Step 1000: Define a surface area 102 on the semiconductor die 100.

Step 1010: Form a plurality of pads 110 inside the semiconductor die 100.

Step 1020: Form a passivation layer 130 on the plurality of pads 110.

Step 1030: Form a plurality of openings 140 on the passivation layer 130 to expose the plurality of pads 110.

Step 1040: Form a conducting adhesive layer 160 on the surface area 102 to fulfill the plurality of openings 140 to connect the plurality of pads 110 so as to solve the IR drop of the semiconductor die 100.

In addition, the fabricating method of the semiconductor device 200 comprising the semiconductor die 100 can further comprise the following steps:

Step 1050: Form a dummy die 210 on the conducting adhesive layer 160, so as to stabilize conducting performance of the adhesive layer 160.

Step 1060: Form a molder 220 to surround the dummy die 210 and seal the semiconductor die 100.

Step 1070: Form a heat sink 230 on the dummy die 210 and the molder 220.

Please note that the above embodiment is only for an illustrative purpose and is not meant to be a limitation of the present invention. For example, it is also practical to replace the dummy die 210 with a metal layer.

Figure 5:
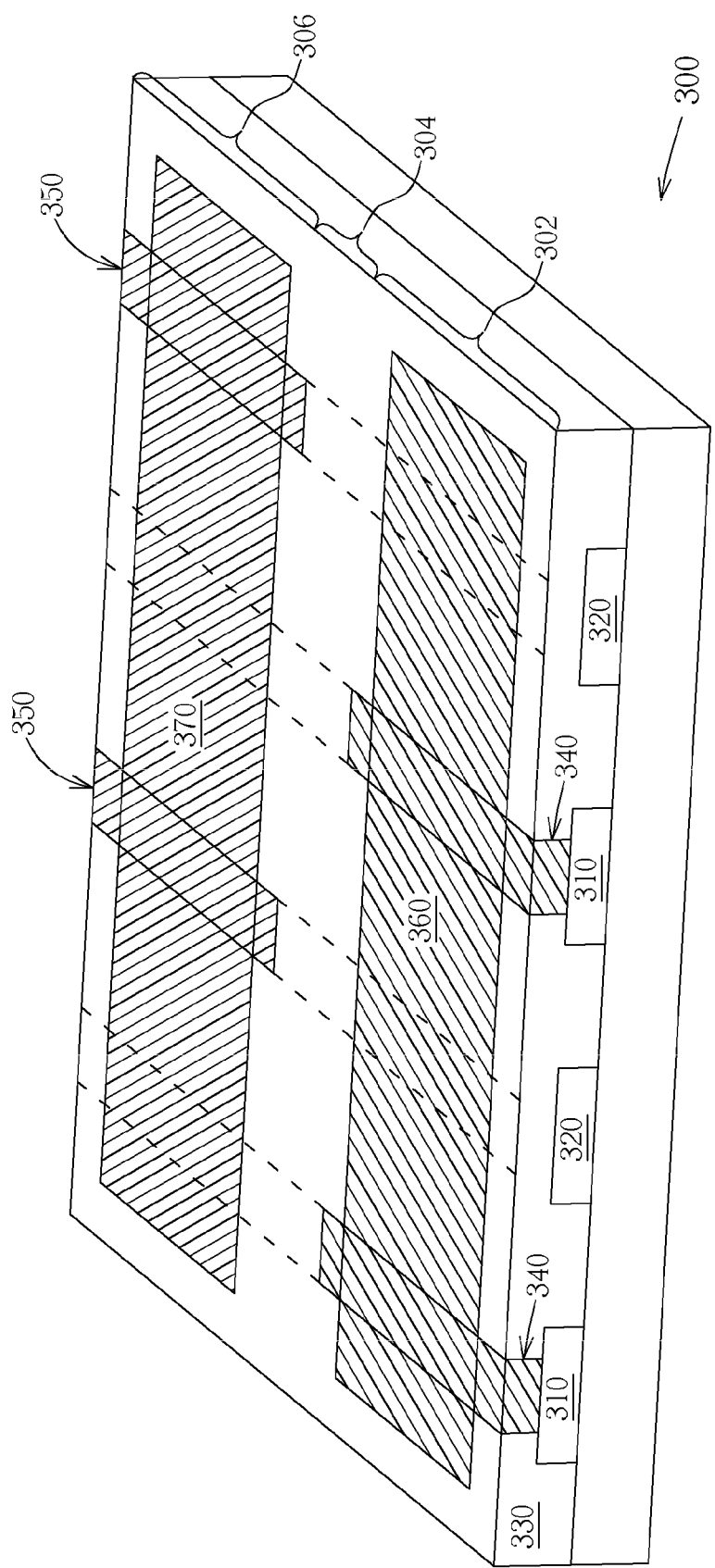
FIG. 5 shows a simplified 3-D diagram of a semiconductor die in accordance with a third embodiment of the present invention.

Please refer to FIG. 5. FIG. 5 shows a simplified 3-D diagram of a semiconductor die 300 in accordance with a third embodiment of the present invention. As shown in FIG. 5, the semiconductor die 300 comprises a first surface area 302, a second surface area 304, a third surface area 306, a plurality of ground pads 310, a plurality of power pads 320, a passivation layer 330, a plurality of first openings 340, a plurality of second openings 350, a first conducting medium layer 360, and a second conducting medium layer 370, wherein the first conducting medium layer 360 and the second conducting medium layer 370 can be conducting adhesive layers such as the conducting resin. The third surface area 306 is positioned between the first surface area 302 and the second surface area 304. Each of the plurality of ground pads 310 has a first part disposed under the first surface area 302, a second part disposed under the second surface area 304, and a third part disposed under the third surface area 306. Each of the plurality of power pads 320 has a first part disposed under the first surface area 302, a second part disposed under the second surface area 304, and a third part disposed under the third surface area 306. The passivation layer 330 is disposed on the plurality of ground pads 310 and the plurality of power pads 320. The plurality of first openings 340 are formed on the passivation layer 330, and utilized for exposing the first parts of the plurality of ground pads 310. The plurality of second openings 350 are formed on the passivation layer 330, and utilized for exposing the second parts of the plurality of power pads 320. The first conducting medium layer 360 is formed on the first surface area 302, and utilized for fulfilling the plurality of first openings 340 to connect the plurality of ground pads 310 and form a ground area. The second conducting medium layer 370 is formed on the second surface area 304, and utilized for fulfilling the plurality of second openings 350 to connect the plurality of power pads 320 and form a power area. In this way, the IR drop of the semiconductor die 300 can be solved.

Figure 6:
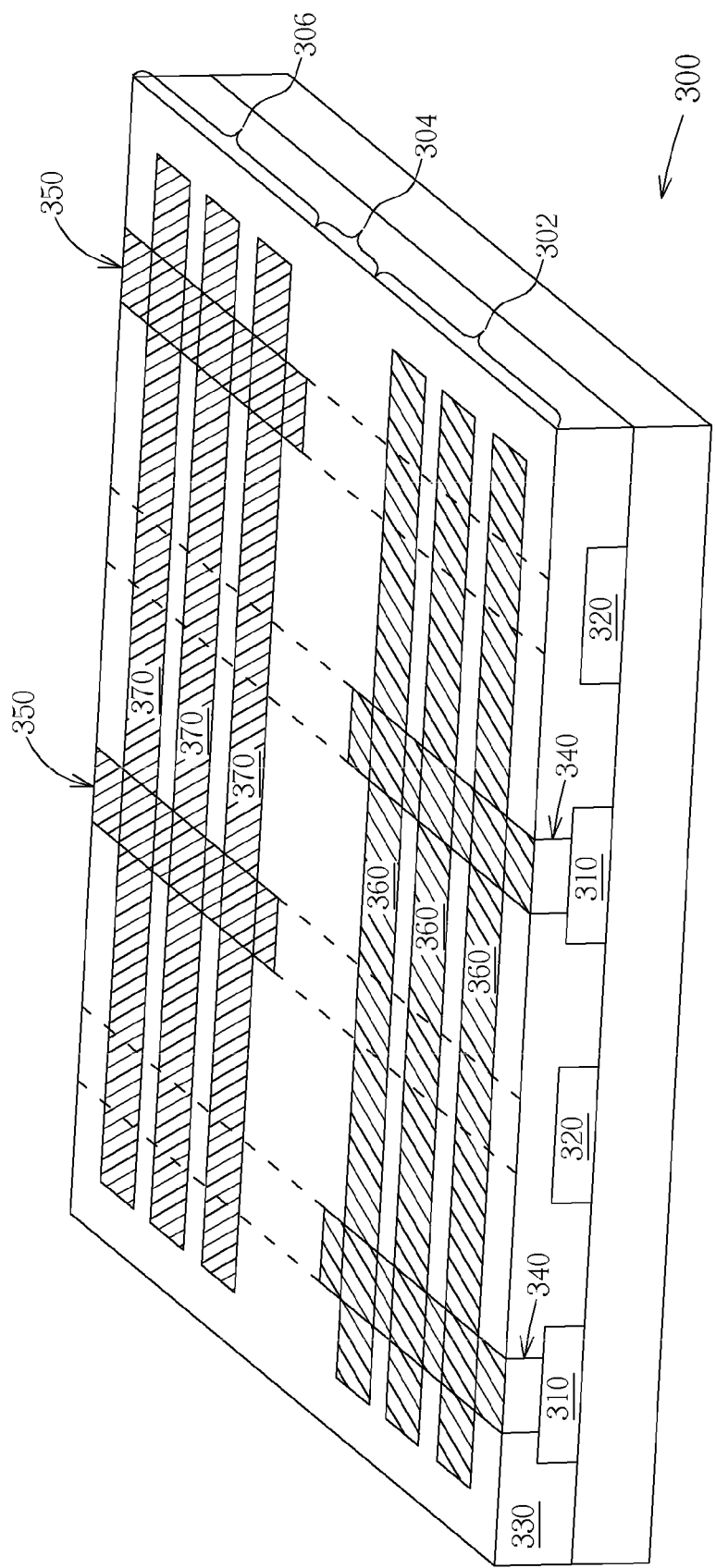
FIG. 6 shows another simplified 3-D diagram of the semiconductor die in accordance with the third embodiment of the present invention.
Figure 7:
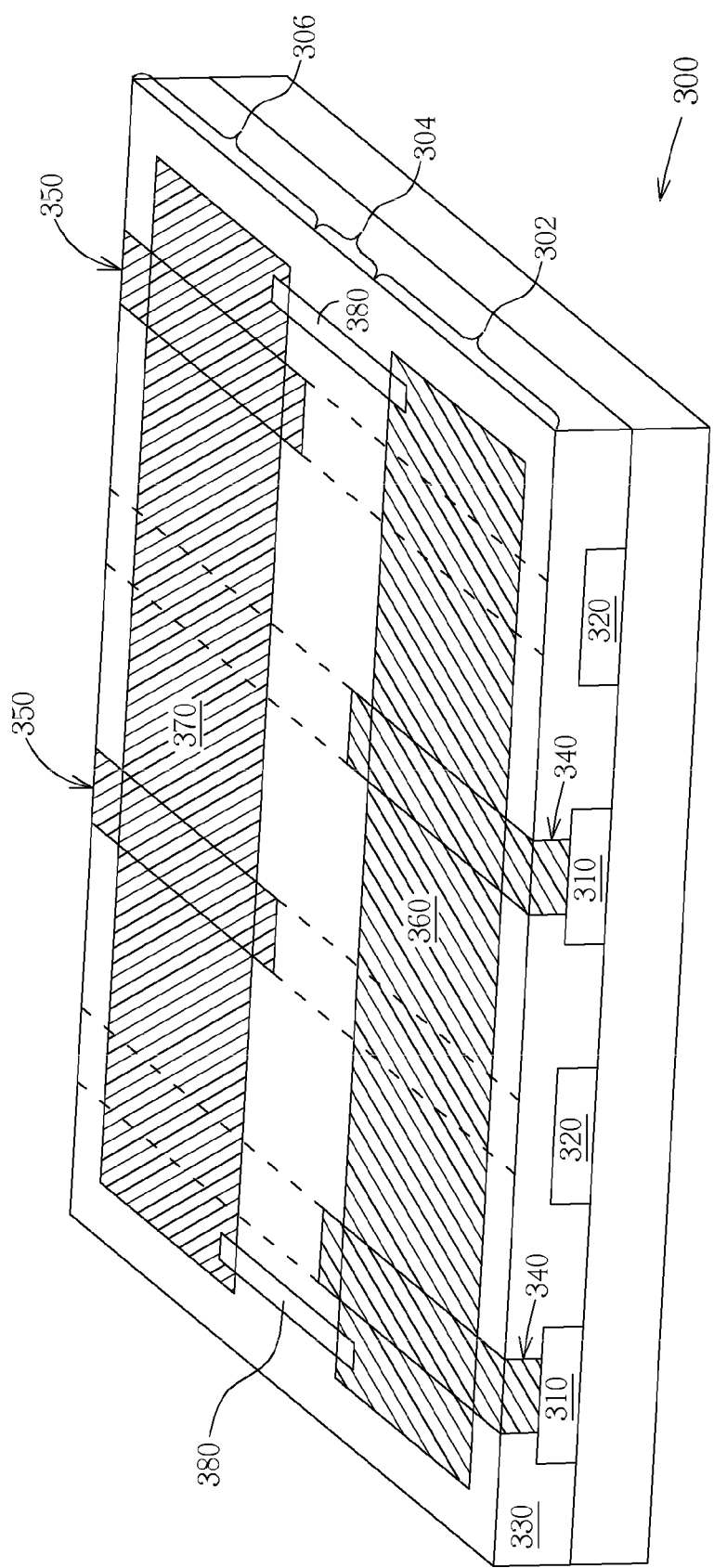
FIG. 7 shows another simplified 3-D diagram of the semiconductor die in accordance with the third embodiment of the present invention.

Please note that the above embodiment is only for an illustrative purpose and is not meant to be a limitation of the present invention. For example, the shapes of the first conducting medium layer 360 and the second conducting medium layer 370 are not limited to be bulks as shown in FIG. 5, and the shapes of the first conducting medium layer 360 and the second conducting medium layer 370 also can be slices as shown in FIG. 6. In addition, the semiconductor die 300 can further comprise at least a capacitor 380 formed on the semiconductor die and coupled between the first conducting medium layer 360 and the second conducting medium layer 370 as shown in FIG. 7. The capacitor 380 is utilized for decoupling the first conducting medium layer 360 and the second conducting medium layer 370. In addition, the semiconductor die 300 also can have a plurality of ground areas and a plurality of power areas.

Figure 8:
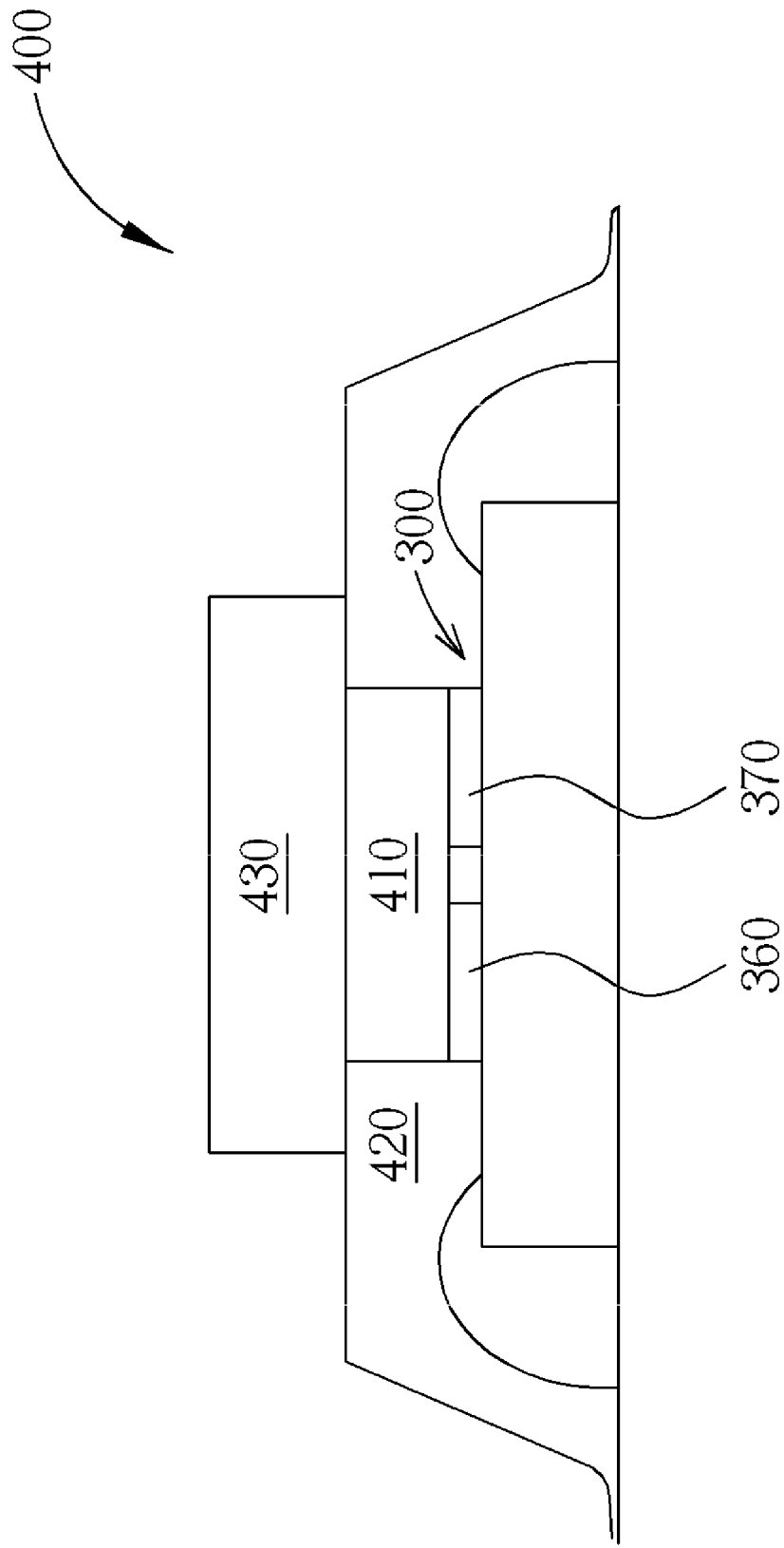
FIG. 8 shows a simplified diagram of a semiconductor device (i.e. a chip) comprising the semiconductor die shown in FIG. 4 in accordance with a fourth embodiment of the present invention.
Figure 9:
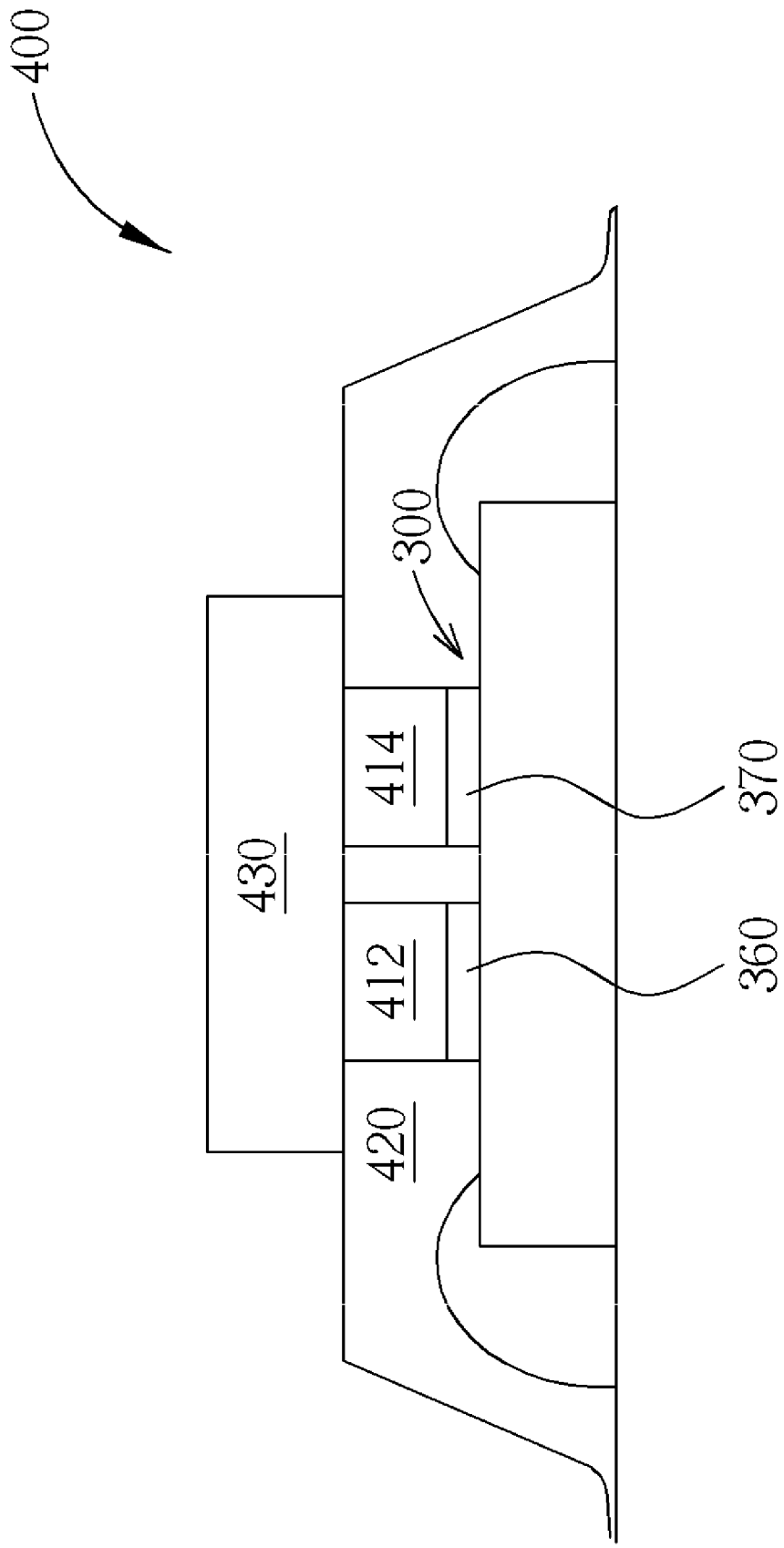
FIG. 9 shows another simplified diagram of the semiconductor device in accordance with the fourth embodiment of the present invention.
Figure 10:
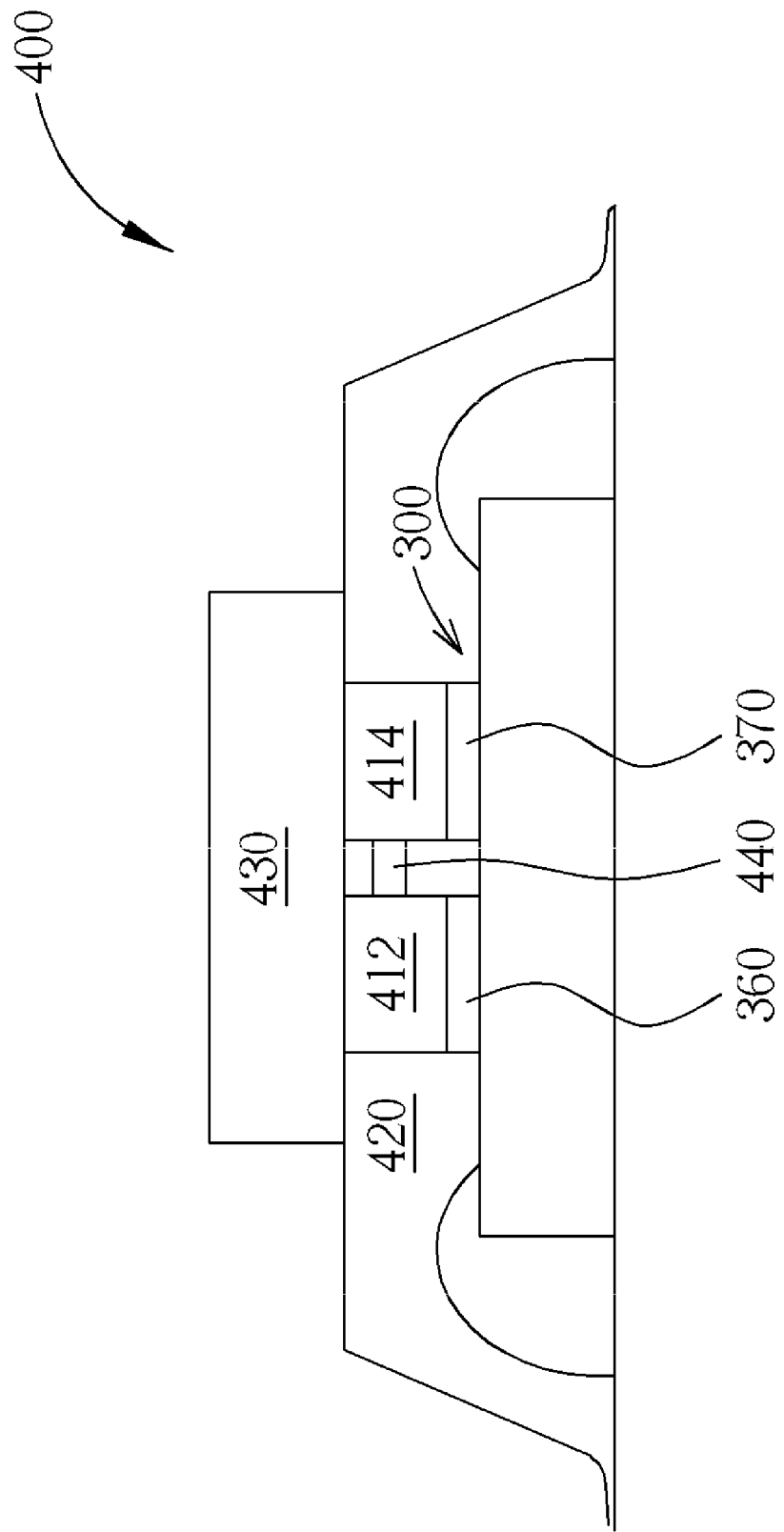
FIG. 10 shows another simplified diagram of the semiconductor device in accordance with the fourth embodiment of the present invention.

Please refer to FIG. 8. FIG. 8 shows a simplified diagram of a semiconductor device (i.e. a chip) 400 comprising the semiconductor die 300 in accordance with a fourth embodiment of the present invention. As shown in FIG. 8, the semiconductor device 300 further comprises a dummy die 410, a molder 420, and a heat sink 430. The dummy die 410 is disposed on the first conducting medium layer 360 and the second conducting medium layer 370 of the semiconductor die 300, and utilized for stabilizing conducting performance of the first conducting medium layer 360 and the second conducting medium layer 370 and dissipating heat from the semiconductor die 300. The molder 420 is utilized for surrounding the dummy die 410 and sealing the semiconductor die 300. The heat sink 430 is formed on the dummy die 410 and the molder 420. Please note that the above embodiment is only for an illustrative purpose and is not meant to be a limitation of the present invention. For example, the dummy die 410 can be replaced with a first metal layer 412 and a second metal layer 414 as shown in FIG. 9. The first metal layer 412 is disposed on the first conducting medium layer 360 of the semiconductor die 300, and utilized for stabilizing conducting performance of the first conducting medium layer 360 and dissipating heat from the semiconductor die 300. The second metal layer 414 is disposed on the second conducting medium layer 370 of the semiconductor die 300, and utilized for stabilizing conducting performance of the second conducting medium layer 370 and dissipating heat from the semiconductor die 300. In addition, the semiconductor die 300 can further comprise at least a capacitor 440 coupled between the first metal layer 412 and the second metal layer 414 as shown in FIG. 10. The capacitor 440 is utilized for decoupling the first metal layer 412 and the second metal layer 414, so as to improve the power integrity performance.

Figure 11:
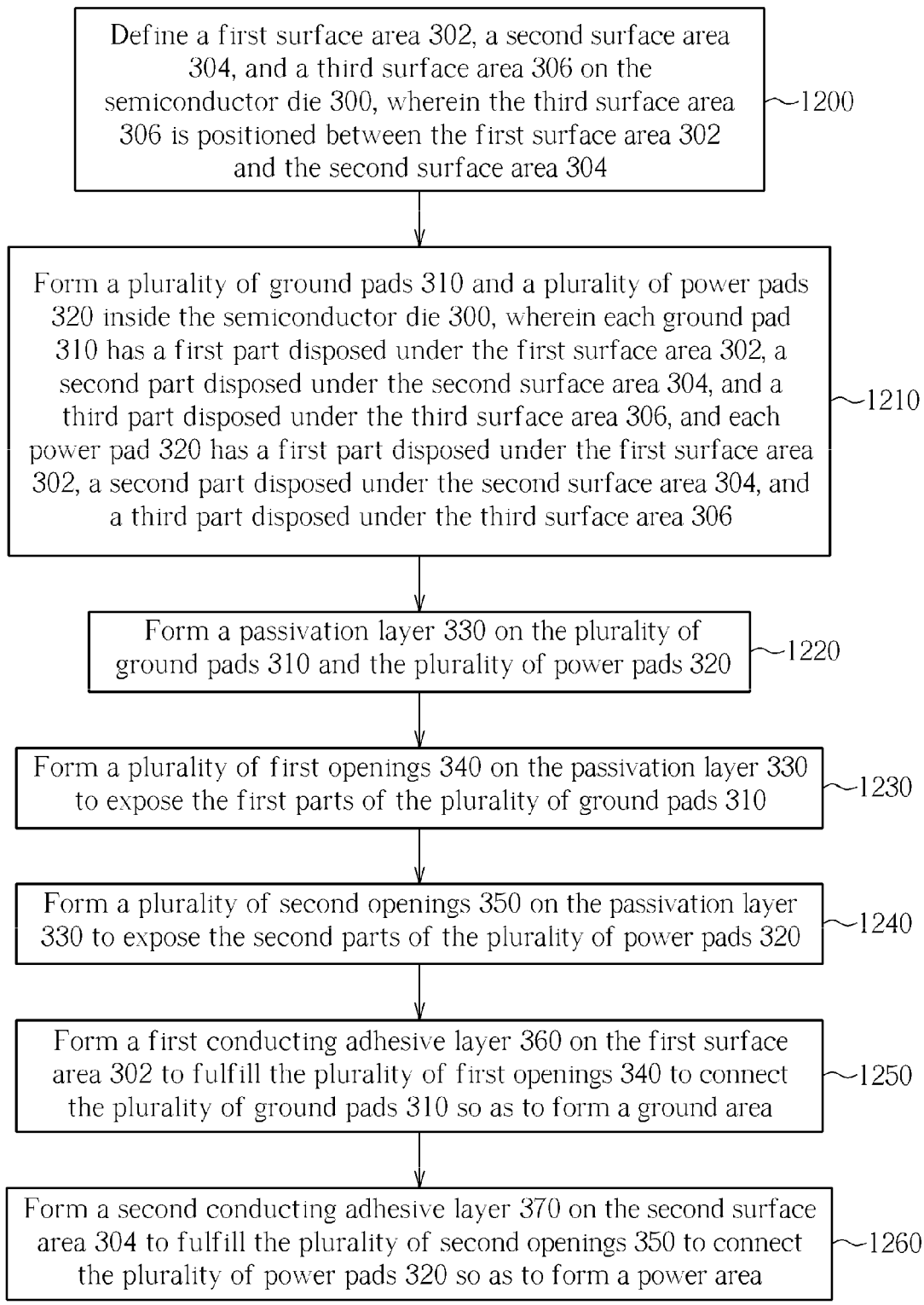
FIG. 11 is a process flowchart showing a fabricating method of the semiconductor device comprising the semiconductor die shown in FIG. 8.

Please refer to FIG. 11. FIG. 11 is a process flowchart showing a fabricating method of the semiconductor device 400 comprising the semiconductor die 300. Provided that substantially the same result is achieved, the steps of the process flowchart need not be in the exact order shown and need not be contiguous, that is, other steps can be intermediate. The fabricating method of the semiconductor device 400 comprising the semiconductor die 300 according to the present invention comprises the following steps:

Step 1200: Define a first surface area 302, a second surface area 304, and a third surface area 306 on the semiconductor die 300, wherein the third surface area 306 is positioned between the first surface area 302 and the second surface area 304.

Step 1210: Form a plurality of ground pads 310 and a plurality of power pads 320 inside the semiconductor die 300, wherein each ground pad 310 has a first part disposed under the first surface area 302, a second part disposed under the second surface area 304, and a third part disposed under the third surface area 306, and each power pad 320 has a first part disposed under the first surface area 302, a second part disposed under the second surface area 304, and a third part disposed under the third surface area 306.

Step 1220: Form a passivation layer 330 on the plurality of ground pads 310 and the plurality of power pads 320.

Step 1230: Form a plurality of first openings 340 on the passivation layer 330 to expose the first parts of the plurality of ground pads 310.

Step 1240: Form a plurality of second openings 350 on the passivation layer 330 to expose the second parts of the plurality of power pads 320.

Step 1250: Form a first conducting adhesive layer 360 on the first surface area 302 to fulfill the plurality of first openings 340 to connect the plurality of ground pads 310 so as to form a ground area.

Step 1260: Form a second conducting adhesive layer 370 on the second surface area 304 to fulfill the plurality of second openings 350 to connect the plurality of power pads 320 so as to form a power area.

In addition, the fabricating method of the semiconductor device 400 comprising the semiconductor die 300 can further comprise the following steps:

Step 1270: Form at least a capacitor 440 on the semiconductor die 300 and coupled between the first conducting adhesive layer 360 and the second conducting adhesive layer 370, so as to decouple the first conducting adhesive layer 360 and the second conducting adhesive layer 370.

Step 1280: Form a dummy die 410 on the first conducting adhesive layer 360 and the second conducting adhesive layer 370, so as to stabilize conducting performance of the first adhesive layer 360 and the second conducting adhesive layer 370 and dissipating heat from the semiconductor die 300.

Step 1290: Form a molder 420 to surround the dummy die 410 and seal the semiconductor die 300.

Step 1300: Form a heat sink 430 on the dummy die 410 and the molder 420.

In another embodiment, the fabricating method of the present invention can further comprise the following steps:

Step 1272: Form at least a capacitor 440 on the semiconductor die 300 and coupled between the first conducting adhesive layer 360 and the second conducting adhesive layer 370, so as to decouple the first conducting adhesive layer 360 and the second conducting adhesive layer 370.

Step 1282: Form a first metal layer 412 on the first conducting adhesive layer 360, so as to stabilize conducting performance of the first adhesive layer 360 and dissipating heat from the semiconductor die 300.

Step 1284: Form a second metal layer 414 on the second conducting adhesive layer 370, so as to stabilize conducting performance of the second conducting adhesive layer 370 and dissipating heat from the semiconductor die 300.

Step 1292: Form a molder 420 to surround the first metal layer 412 and the second metal layer 414 and seal the semiconductor die 300.

Step 1302: Form a heat sink 430 on the first metal layer 412, the second metal layer 414, and the molder 420.

Please note that the above embodiment is only for an illustrative purpose and is not meant to be a limitation of the present invention. For example, it is also practical to form the capacitor 440 between the first metal layer 412 and the second metal layer 414 to decouple the first metal layer 412 and the second metal layer 414.

Briefly summarized, since the conducting adhesive layer (such as the conducting resin) is a low cost medium to conduct electricity and relieve thermal heat, the semiconductor devices disclosed by the present invention are obviously capable of solving the IR drop and relieving thermal heat of the semiconductor die with low cost. In addition, if the semiconductor die surface has lower high/low aspect ratio, then it is practical to replace the conducting adhesive layer with a conducting tape.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
  a semiconductor die, comprising:
    a first surface area;
    a plurality of first pads potentially equivalent to each other;
    a passivation layer, disposed on the plurality of first pads;
    a plurality of first openings, formed on the passivation layer, for exposing the plurality of first pads; and
    a first conducting medium layer, formed on the first surface area, for fulfilling the plurality of first openings to connect the plurality of first pads; and
  a dummy die, disposed on the first conducting medium layer, for stabilizing conducting performance of the first conducting medium layer and dissipating heat from the semiconductor die.

2. The semiconductor device of claim 1, further comprising a molder surrounding the dummy die and sealing the semiconductor die.

3. The semiconductor device of claim 2, further comprising a heat sink formed on the dummy die and the molder.

4. A semiconductor device, comprising:
 a semiconductor die, comprising:
  a first surface area;
  a plurality of first pads potentially equivalent to each other;
  a passivation layer, disposed on the plurality of first pads;
  a plurality of first openings, formed on the passivation layer, for exposing the plurality of first pads; and
  a first conducting medium layer, formed on the first surface area, for fulfilling the plurality of first openings to connect the plurality of first pads; and
 a metal layer, disposed on the first conducting medium layer of the semiconductor die, for stabilizing conducting performance of the first conducting medium layer and dissipating heat from the semiconductor die.

5. The semiconductor device of claim 4, further comprising a molder surrounding the metal layer and sealing the semiconductor die.

6. The semiconductor device of claim 5, further comprising a heat sink formed on the metal layer and the molder.

7. A semiconductor device, comprising:
 a semiconductor die, comprising:
  a first surface area;
  a plurality of first pads potentially equivalent to each other;
  a passivation layer, disposed on the plurality of first pads;
  a plurality of first openings, formed on the passivation layer, for exposing the plurality of first pads;
  a first conducting medium layer, formed on the first surface area, for fulfilling the plurality of first openings to connect the plurality of first pads;
  a second surface area;
  a third surface area, positioned between the first surface area and the second surface area, wherein each first pad has a first part disposed under the first surface area, a second part disposed under the second surface area, and a third part disposed under the third surface area, and the first parts of the plurality of first pads are exposed by the plurality of first openings;
  a plurality of second pads potentially equivalent to each other, each second pad having a first part disposed under the first surface area, a second part disposed under the second surface area, and a third part disposed under the third surface area, wherein the passivation layer is further disposed on the plurality of second pads;
  a plurality of second openings, formed on the passivation layer, for exposing the second parts of the plurality of second pads; and
  a second conducting medium layer, formed on the second surface area, for fulfilling the plurality of second openings to connect the plurality of second pads.

8. The semiconductor device of claim 7, wherein the plurality of first pads are ground pads, and the plurality of second pads are power pads.

9. The semiconductor device of claim 7, wherein the semiconductor die further comprises at least a capacitor, formed on the semiconductor die and coupled between the first conducting medium layer and the second conducting medium layer, for decoupling the first conducting medium layer and the second conducting medium layer.

10. The semiconductor device of claim 7, further comprising a dummy die, disposed on the first conducting medium layer and the second conducting medium layer, for stabilizing conducting performance of the first medium layer and the second conducting medium layer and dissipating heat from the semiconductor die.

11. The semiconductor device of claim 10, further comprising a molder surrounding the dummy die and sealing the semiconductor die.

12. The semiconductor device of claim 11, further comprising a heat sink formed on the dummy die and the molder.

13. The semiconductor device of claim 7, further comprising:
 a first metal layer, disposed on the first conducting medium layer of the semiconductor die, for stabilizing conducting performance of the first conducting medium layer and dissipating heat from the semiconductor die; and
 a second metal layer, disposed on the second conducting medium layer of the semiconductor die, for stabilizing conducting performance of the second conducting medium layer and dissipating heat from the semiconductor die.

14. The semiconductor device of claim 13, further comprising a molder surrounding the first metal layer and the second metal layer and sealing the semiconductor die.

15. The semiconductor device of claim 14, further comprising a heat sink formed on the first metal layer, the second metal layer, and the molder.

16. The semiconductor device of claim 13, further comprising at least a capacitor, coupled between the first metal layer and the second metal layer, for decoupling the first conducting medium layer and the second conducting medium layer.

17. The semiconductor device of claim 1, wherein the first conducting medium layer is a conducting adhesive layer or a conducting tape.

18. The semiconductor device of claim 7, wherein the first conducting medium layer and the second conducting medium layer are conducting adhesive layers or conducting tapes.

* * * * *